United States Patent [19]

Chadi

[11] Patent Number: 5,139,960
[45] Date of Patent: Aug. 18, 1992

[54] INTERSTITITAL DOPING IN III-V SEMICONDUCTORS TO AVOID OR SUPPRESS DX CENTER FORMATION

[75] Inventor: James D. Chadi, Woodside, Calif.

[73] Assignee: Xerox Corporation, Stamford, Conn.

[21] Appl. No.: 700,101

[22] Filed: May 8, 1991

Related U.S. Application Data

[63] Continuation of Ser. No. 276,824, Nov. 28, 1988, abandoned.

[51] Int. Cl.$^5$ .......................................... H01L 21/265
[52] U.S. Cl. ......................................... 437/33; 437/22; 437/96; 437/104; 437/133; 148/DIG. 97; 148/DIG. 84
[58] Field of Search .................... 437/22, 23, 132, 133, 437/33, 96, 104; 148/DIG. 97, DIG. 84

[56] References Cited

U.S. PATENT DOCUMENTS

| | | | |
|---|---|---|---|
| 4,383,872 | 5/1983 | Roberts | 148/175 |
| 4,618,381 | 10/1986 | Sato et al. | 148/189 |
| 4,670,176 | 6/1987 | Morioka et al. | 252/62.3 GA |
| 4,685,979 | 8/1987 | Nishizawa | 437/81 |
| 4,689,094 | 8/1987 | Van Rees et al. | 437/104 |
| 4,717,681 | 1/1988 | Curran | 437/31 |
| 4,745,448 | 5/1988 | Van Rees et al. | 357/22 |

OTHER PUBLICATIONS

D. V. Lang et al. "Trapping Characteristics and a Donor-Complex (DX) Model for the Persistent-Photoconductivity Trapping Center in Te-Doped Al$_x$Ga$_{1-x}$As", *Physical Review B*, vol. 19(2), pp. 1015–1030, Jan. 15, 1979.

D. V. Lang et al., "Large-Lattice-Relaxation Model for Persistent Photo-Conductivity in Compound Semiconductors", *Physical Review Letters*, vol. 39(10), pp. 635–639, Sep. 15, 1977.

D. V. Lang, Chapter 7 entitled "DX Centers in III-V Alloys" in the book, *Deep Centers in Semiconductors*, edited by S. T. Pantelides, pp. 489–539 (Gordon and Breach, N.Y., 1986).

M. Mizuta et al., "Direct Evidence for the DX Center Being a Substitutional Donor in AlGaAs Alloy System", *Japanese Journal of Applied Physics*, vol. 24(2), pp. L143–L146, Feb. 1985.

N. Lifshitz et al., "Pressure and Compositional Dependence of the Hall Coefficient in Al$_x$Ga$_{1x}$As and Their Significance", *Physical Review B*, vol. 21(2), pp. 670–678, Jan. 25, 1980.

T. N. Theis et al., "Electron Localization by a Metastable Donor Level in n-GaAs: A New Mechanism Limiting the Free-Carrier Density", *Physical Review Letters*, vol. 60(4), pp. 361–364, Jan. 25, 1988.

J. R. Kirtley et al., "Noise Spectroscopy of Deep Level (DX) Centers in GaAs–Al$_x$Ga$_{1-x}$As Heterostructures", *Journal of Applied Physics*, vol. 63(5), pp. 1541–1548, Mar. 1, 1988.

P. M. Mooney et al., "Evidence for Large Lattice Relaxation at the DX Center in Si-Doped Al$_x$Ga$_{1-x}$As", *Physical Review B*, vol. 37(14), pp. 8298–8307, May 15, 1988.

R. J. Higgins et al., "Mobility Enhancement of Modulation-Doped Materials by Low-Temperature Optical Annealing of Spacer-Layer Defect Charge State", *Physical Review B*, vol. 36, pp. 2707–2712, Aug. 15, 1987.

J. A. Van Vechten and J. F. Wager "Consequences of Anion Vacancy Nearest-Neighbor Hopping in III–V Compound Semiconductors: Drift in InP Metal-Insulator-Semiconductor Field Effect Transistors", *Journal of Applied Physics*, vol. 57(6), pp. 1956–1960, May 15, 1985.

(List continued on next page.)

OTHER PUBLICATIONS

J. F. Wager and J. A. Van Vechten, "Atomic Model for the M Center in InP", *Physical Review B,* vol. 32(8), pp. 5251–5258, Oct. 15, 1985.

T. N. Morgan, "Theory of the DX Center in $Al_x Ga_{1-x}As$ and GaAs Crystals", *Physical Review B,* vol. 34, pp. 2664–2669, Aug. 15, 1986.

H. P. Hjalmarson et al. "Deep Donor Model for the Persistent Photoconductivity Effect", *Applied Physics Letters,* vol. 48(10), pp. 656–658, Mar. 10, 1986.

M. F. Li et al., "Effect of Boron on the Deep Donors (DX) Centers in GaAs:Si", *Applied Physics Letters,* vol. (to be published Apr. 1989).

M. F. li et al., "Effect of Boron on the Pressure Induced Deep Donors in GaAs:Si", *Meeting and Bulletin of the American Physical Society,* vol. 33(3), p. 439, Mar. 21–25, 1988, New Orleans, La.

P. Basmaji et al., "Enhancement of the Free Carrier Density in $Ga_{1-x}Al_xAs$ Grown by Metalorganic Vapor Phase Epitaxy Under High Temperature Growth Conditions", *Physica status solidi(a),* vol. 100, pp. K41–K45, 1987.

D. J. Chadi et al., "Metastability of the Isolated Arsenic–Antisite Defect in GaAs", *Physical Review Letters,* vol. 60(21), pp. 2187–2190, May 23, 1988.

G. A. Baraff et al., "EL2 and the Electronic Structure of the $As_{Ga}$–$As_i$ Pair in GaAs: The Role of Jahn–Teller Relaxation", *Materials Research Society Symposium Proceedings,* vol. 104, edited by M. Stavola, S. J. Pearton, and G. Davies, Materials Research Society, Pittsburgh, Pa., pp. 375–386, 1988.

B. Etienne et al., "Reduction in the Concentration of DX Centers in Si–Doped GaAlAs Using the Planar Doping Technique", *Applied Physics Letters,* vol. 52(15), pp. 1237–1239, Apr. 11, 1988.

J. D. Chadi et al., "Theory of the Atomic and Electronic Structure of DX Centers in GaAs and $Al_xGa_{1-x}As$ alloys", *Physics Review Letters,* vol. 61(7), pp. 873–876, Aug. 15, 1988.

INTERSTITITAL DOPING IN III-V SEMICONDUCTORS TO AVOID OR SUPPRESS DX CENTER FORMATION

GOVERNMENT RIGHTS

This invention was made, in part, with Government support under Contract No. N00014-82-C-0244 awarded by the Office of Naval Research. The Government has certain rights in this invention.

This is a continuation of application Ser. No. 07/276,824, filed Nov. 28, 1988, now abandoned.

BACKGROUND OF THE INVENTION

This invention relates to the elimination or suppression of deep trap centers in III-V semiconductors and in particular the suppression of deep donor states or DX centers in III-V semiconductors, such as GaAs, and AlGaAs alloys, and GaAsP GaAsSb, AlGaAsP, and GaInAsP alloys.

Group III-V alloys, such as $Al_xGa_{1-x}As$, are increasingly becoming important materials because of their applications in optoelectronics and in heterojunction devices, such as, high electron mobility transistors (HEMT). In the case of n-$Al_xGa_{1-x}As$, particularly where $x \geq 22\%$, there is a sharp decrease in conductivity, and a persistent photoconductivity effect resulting from the formation of deep traps, which adversely affect device operations. Group IV or Group VI n-type dopants simultaneously provide a shallow donor near the conduction band and a deep donor level, which acts as an electron trap state and has been associated with a defect center labeled as DX. The shallow levels become largely unoccupied and inactive as a result of deep trap formation in $Al_xGa_{1-x}As$ alloys where $x \geq 22\%$. See, for example, the articles of D. V. Lang et al. entitled "Trapping Characteristics and a Donor-Complex (DX) Model for the Persistent-Photoconductivity Trapping Center in Te-Doped $Al_xGa_{1-x}As$", *Physical Review B*, Vol. 19, pp. 1015-1030, 1979; "Large-Lattice-Relaxation Model for Persistent PhotoConductivity in Compound Semiconductors", *Physical Review Letters*, Vol. 39, pp. 635-639, 1977; and D. V. Lang at pp. 489-539 in the book *"Deep Centers in Semiconductors"*, edited by S. T. Pantelides (Gordon and Breach, New York, 1986). The DX center arises when $Al_xGa_{1-x}As$ alloys are doped with either group IV or group VI atoms which preferentially substitute for Ga (or Al) and As atoms, respectively, i.e., substitutional doping occurs, which to those skilled in the art is the common and preferred manner of doping in most III-V semiconductors, vis a vis interstitial doping, which is not regarded as being as stable, suitable or, defect free. Present thinking in the art does not consider interstitials as suitable shallow-donor dopants because of a belief that these donors are unstable and are apt to diffuse rapidly away from the bulk and onto the surface where they are not wanted, and it leans toward their elimination with the conviction that substitutional atoms in combination with other forms of treatment represent the best mode for decreasing, if not eliminating, defect problems in the lattice. See, as an example, U.S. Pat. No. 4,745,448 issued May 17, 1988.

Recent work has revealed that the DX center is also present as a metastable center in n-type GaAs. Its density, for example, in GaAs can be increased in various ways, e.g., through: (1) application of pressures in excess of 20 kbars (See, for example, M. Mizuta et al., "Direct Evidence for the DX Center Being a Substitutional Donor in AlGaAs Alloy System", *Japanese Journal of Applied Physics*, Vol. 24, p. L143 et seq., 1985; N. Lifshitz et al., "Pressure and Compositional Dependence of the Hall Coefficient in $Al_xGa_{1-x}As$ and Their Significance" *Physical Review B*, Vol. 21, pp. 670-678, 1980; (2) an increase in the dopant concentration to about $10^{19}/cm^3$ (See, for example, T. N. Theis et al., "Electron Localization by a Metastable Donor Level in n-GaAs: A New Mechanism Limiting the Free-Carrier Density", *Physical Review Letters*, Vol. 60, pp. 361-364, 1988); or (3) simply by raising the temperature (See, for example, J. R. Kirtley et al., "Noise Spectroscopy of Deep Level (DX) Centers in GaAs-$Al_xGa_{1-x}As$ Heterostructures", *Journal of Applied Physics*, Vol. 63, pp. 1541-1548, 1980.

The DX center exhibits a very large Stokes shift of approximately 1 eV between its thermal and optical ionization energies. Lang, supra, and others, such as Mooney (P. M. Mooney et al., "Evidence for Large Lattice Relaxation at the DX Center in Si-Doped $Al_xGa_{1-x}As$", *Physical Review B*, Vol. 37, pp. 8298-8307, 1988), attribute this to a large lattice relaxation. Lang employed a simple configuration coordinate diagram to show that the large optical gap was consistent with the measured emission and capture barriers for this center. Since, at the time in 1977, a large relaxation appeared unlikely to occur for an isolated donor, it was also proposed that the DX center resulted from the formation of a complex consisting of the donor (D) and an unknown or unidentified defect (X), possibly an As vacancy. This donor-vacancy model has been examined by Van Vechten and collaborators, for example in: R. J. Higgins et al., "Mobility Enhancement of Modulation-Doped Materials by Low-Temperature Optical Annealing of Spacer-Layer Defect Charge State" *Physical Review B*, Vol. 36, pp. 2707-2712, 1987; Van Vechten et al. for the case of the analogous "M center" in InP: J. A. Van Vechten and J. F. Wager "Consequences of Anion Vacancy Nearest-Neighbor Hopping in III-V Compound Semiconductors: Drift in InP Metal-Insulator-Semiconductor Field Effect Transistors", *Journal of Applied Physics*, Vol. 57, pp. 1956-1960, 1985; J. F. Wager and J. A. Van Vechten, "Atomic Model for the M Center in InP", *Physical Review B*, Vol. 32, pp. 5251-5258, 1985.

The defect-complex model for DX, while attractive in explaining many properties of the DX center, has been recently challenged and the possibility that the DX center arises per se from the substitutional donor itself has received increasing attention. The prevailing view now ascribes DX formation to a Jahn-Teller distortion of the donor with either large or small lattice relaxations [See T. N. Morgan, "Theory of the DX Center in $Al_xGa_{1-x}As$ and GaAs Crystals", *Physical Review B*, Vol. 34, pp. 2664-2669, 1986; H. P. Hjalmarson et al. "Deep Donor Model for the Persistent Photoconductivity Effect" *Applied Physics Letters*, Vol. 48, pp. 656-658, 1986.]. Results from most recent experiments (Mooney et al., supra) tend to favor a large lattice relaxation model.

Recent work of Peter Yu and coworkers [M. F. Li, P. Y. Yu, W. Shan, W. Hansen, and E. R. Weber, "Effect of Boron on the Deep Donors (DX Centers in GaAs:Si" (to be published in *Applied Physics Letters*)] have demonstrated that when B is introduced into GaAs doped with Si, the DX centers disappear and new deep donors with significantly reduced binding energies and capture barrier heights appear. They explain this change to be caused by a direct interaction of B with Si which results from some type of B-Si complex formation arising from the lattice strain induced by the smaller B atom when it becomes substitutionally incorporated in the lattice. See M. F. Li et al., "Effect of Boron on the Pressure Induced Deep Donors in GaAs:Si", *Meeting and Bulletin of the American Physical Society*, Vol. 33(3), p. 439, Mar. 21-25, 1988, New Orleans, La. Also, P. Basmaji et al. "Enhancement of the Free Carrier Density in $Ga_{1-x}Al_xAs$ Grown by Metalorganic Vapor Phase Epitaxy Under High Temperature Growth Conditions" *Physica status solidi (a)*, Vol. 100, pp. K41-K45, 1987, found that the free electron concentration in n-type $Al_xGA_{1-x}As$ increased dramatically under high As/(Ga+Al) ratios of 95 and growth temperatures of 950° C. in metalorganic vapor phase epitaxy. This change was attributed to the increase in growth temperature that possibly brought about a greater solubility of shallow donors, or possibly a decrease in the number of deep donor levels, or possibly by an unknown change in the nature of the deep donor levels.

What is needed is a fundamental understanding, on a microscopic basis, of what causes the formation of the DX center and then means which can be employed to prevent the formation of the DX center in the lattice structure of III-V semiconductors.

SUMMARY OF THE INVENTION

I have confirmed using state of the art theoretical methods that the deep donor level or DX center comes directly from the substitutional donor itself, that there is, in reality, no unknown or unidentified defect (X). The most important new idea to emerge from this study is that past thinking is incorrect relative to the ineffectiveness and undesirability of interstitial doping and that substitutional donor type dopants are the root cause of the DX center in AlGaAs alloys having an Al concentration greater than 22% (atomic, on cation lattice). According to this invention, interstitial incorporation of Group V or Group III dopants, such as As, Sb, P, Ga, Al, In or B, in a III-V semiconductor, such as GaAs or $Al_xGa_{1-x}As$, in the absence of any substitutional doping via a Group IV or Group VI dopant, will avoid or substantially eliminate, if not completely suppress, the formation of the DX center in the III-V semiconductor without significantly affecting the structural stability of the III-V semiconductor lattice.

I have discovered that not only does the DX center arise from the use of substitutional group IV and group VI dopants in GaAs and $Al_xGa_{1-x}As$ but that also these centers can be suppressed, if not eliminated, by employing Group III and Group V interstitial dopants, while avoiding group IV and group VI substitutional dopants. As not appreciated by those skilled in the art, Group V and Group III dopants may be incorporated in the crystal lattice and function as interstitial shallow donors and not as deep level acceptors as might be expected for Group III dopants. The problem has been further complicated by the fact that those skilled in the art have continued to use Groups IV and VI dopants in III-V semiconductors followed by a multitude of different and separately oriented one or another treatments, as previously alluded in the Background, in an attempt to reduce the DX center while not realizing and appreciating that the substitutional Groups IV and VI dopants per se will always cause the formation of DX centers. Further, as indicated above, those skilled in the art would not generally consider the use of either Group V and particularly Group III dopants because it is widely believed that these dopants are far less desirable in their properties and in the case of Group III would lead to p-type instead of n-type doping when it enters the lattice on a substitutional site.

Other objects and attainments together with a fuller understanding of the invention will become apparent and appreciated by referring to the following description and claims taken in conjunction with the accompanying drawings.

BRIEF DESCRIPTION OF THE DRAWINGS

FIGS. 8A, 8B, 8C and 8D are schematic views of the normal substitutional sites and the broken bond configurations giving rise to the DX centers in Si and S doped AlGaAs alloys.

DETAILED DESCRIPTION OF THE PREFERRED EMBODIMENTS

Figure 1:
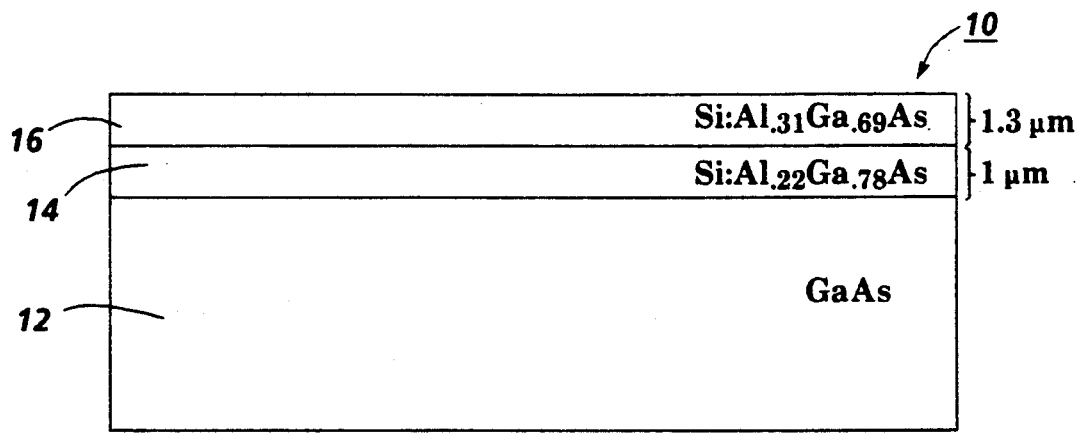
FIG. 1 is a schematic representation of a first of three samples fabricated and tested according to the teachings of this invention.

I. Suppressing the DX Center Formation by Substitutional Doping

It has been traditionally believed that the DX center is a defect associated with all donors in AlGaAs and other III-V alloys. This idea has become widespread and has had experimental support whenever donor type dopants from Group IV and Group VI dopants, have been used in GaAs or $Al_xGa_{1-x}As$ alloys. The implicit assumption has been that the DX center will always appear in these n-type doped samples. My studies and work indicate that the DX center is associated with a substitutional type of donor per se and not with nonsubstitutional or interstitial donors. In this connection, reference is made to Part II herein which consists of a physical and mathematical analysis of the the origin of the DX center via structured models comprising Si and S induced DX centers in GaAs and includes an examination also of the energetics of DX formation and its electronic structure. The results were also extended to $Al_xGa_{1-x}As$ alloys via a simple theoretical model which is found to lead to results in impressive agreement with experiment for the binding energy of the DX center as a function of alloying. The conclusions reached from this analysis are that: (i) The DX center is a highly localized and negatively charged center resulting from the reaction, $2d^0 \rightarrow d^+ + DX^-$, where $d^0$ and $d^+$ represent neutral and ionized fourfold coordinated substitutional donors from the Group IV and VI elements. The donors $d^0$ need not be spatially close to each other. What this translates to is that in the case of two substitutional donor atoms, one atom loses an electron (e.g., $d^+ = Si^+$) and another atom gains the electron (e.g., $DX^- = Si^-$). (ii) This defect formation involves a large bond-rupturing displacement of either the donor atom itself, as in for the case of a Group IV dopant such as Si, or one of its nearest-neighbor Ga (or Al) atoms, as in for the case of a group VI dopant such as S, along a bond axis.

The above results, supported by the calculations and analysis in Part II, demonstrate that the formation of a DX center and the concomitant shallow-deep transition of the donor level in n-GaS or $n-Al_xGA_{1-x}As$ is accompanied by a bond breaking distortion at a substitutional donor site in the lattice structure. Thus, can the creation of DX centers be inhibited through the use of donor atoms which give rise to shallow levels but, on the other hand, are not susceptible to this type of lattice instability? The foregoing analysis leads to the indication that the conventional doping procedure which relies on the introduction of substitutional donor atoms from Group IV or Group VI of the Periodic Table into the lattice should be modified or even abandoned since these atoms are a direct consequence of the DX center formation. This particular fact has not been known or appreciated by physicists and those skilled in the art as they have consistently attempted to rid the lattice of III-V semiconductors of the DX center by Group IV and Group VI doping followed by some other treatment or process to determine whether the effect of the DX center is alleviated. Group IV or VI atoms sit primarily at substitutional sites in the lattice and are susceptible to a very large lattice relaxation which will always drive their shallow donor levels into deep donor levels. The bond breaking and lattice relaxation would not result if the doping were carried out interstitially rather than substitutionally. That is, if the atoms are introduced interstitially, i.e., between the other lattice atoms in the crystal, and not substitutionally for crystal atoms, there is an avoidance or significant suppression of the formation of the DX center or deep donor levels. This is because these interstitial atoms do not undergo the same lattice distortions as substitutional atoms and have no energy or motivation to transfer to a deep level, i.e., they are structurally stable. Interstitially they are shallow donors and remain shallow donors.

There are several types of impurities that are possible for interstitial doping and the simplest form for interstitial donors would be Group V and Group III atoms. It is widely believed by those skilled in the art that group III dopants will create acceptors but as supported by the calculations in Part II, interstitial incorporation of Group III atoms will behave as a donor and not an acceptor.

Interstitial Group V dopants, preferably As and Sb, and possibly P and N, are particularly suitable since these dopants are always donors, whether incorporated interstitially or substitutionally into the lattice. A Group V dopant incorporated substitutionally on the wrong lattice site still functions as a donor. An example is As occupying a Ga site (called an As antisite), which is also known as an EL2 center. See, D. J. Chadi et al. "Metastability of the Isolated Arsenic-Antisite Defect in GaAs", *Physical Review Letters*, Vol. 60, pp. 2187–2190, 1988.

Interstitial Group III dopants, preferably Ga Al, and B, are also suitable. Interstitial Group III dopants have three valence electrons two of which are in low energy s-states and would lie below the valence band in $Al_x$-$Ga_{1-x}As$ alloys and are electronically inactive. The remaining p-electron has an energy that, in the limit of weak interactions with neighboring atoms, falls very near or above the conduction band, for B, Ga and Al. The Group III atoms, particularly Ga and Al, may be ideally suited for doping when introduced into interstitial sites. A potential problem, however, in introducing these Group III atoms into the lattice is the possibility of forming substitutional cation antisites which will behave as double acceptors thereby compensating the donor electrons arising from the interstitially introduced atoms. This problem is reduced to acceptable levels if Group III atoms are maximized for interstitial incorporation rather than substitutional incorporation in the lattice. In particular, Ga antisites will be statistically balanced by other donor type defects when Ga is introduced via ion implantation. For example, the creation of an As-interstitial, As-vacancy pair will lead to n-type behavior since the As interstitial and As vacancy defects are individually donor type defects. Without this balance and in the presence of too many antisites, the incorporation of Group III atoms at substitutional sites will result in double acceptor formations which will lead to a neutralization of two donor electrons of two interstitial site electrons. In this case there will be a low supply of electrons to provide for suitable and practical device operation. A specific example is B incorporated in GaAs wherein, besides being incorporated interstitially, it may also incorporate on a Ga site, which results in an isovalent impurity. However, B on a As site provides a double acceptor and effectively neutralizes two donor electrons at separate interstitial As sites in the lattice.

Calculations on As antisite defects interacting with an As interstitial (See: G. A. Baraff et al., "EL2 and the Electronic Structure of the $As_{Ga}$-$As_i$ Pair in GaAs: The Role of Jahn-Teller Relaxation", *Materials Research Society Symposium Proceedings*, Vol. 104, edited by M. Stavola, S. J. Pearton, and G. Davies, Materials Research Society, Pittsburgh, Pa., pp. 375–386, 1988), suggest that an isolated interstitial As atom has an electronic level which lies above the conduction band in GaAs and which, therefore, empties its electron into the conduction band. This electronic level structure provides an explanation as to why the isolated As interstitial, if present in GaAs, has not been detected via electron-spin-resonance experiments. The presence of As interstitials provides a plausible explanation for the large enhancement in the room temperature free carrier density in a limited Al concentration range observed by Basmaji et al., supra, in $Al_xGa_{1-x}As$ alloys grown by metalorganic vapor phase epitaxy (MOVPE) under a high As/(Ga+Al) ratio of 95 and at a high growth temperature of 950° C. The samples in the Basmaji et al. experiment were doped with Sn in Group IV during growth. As explained in more detail later, experiments herein were conducted which clearly demonstrate the detrimental effects of Group IV dopants and which provide clear indication for the feasibility and utility of interstitial doping.

With respect to Group V dopants, As is an excellent choice in the case of high electron mobility transistors (HEMT). The reason is that the incorporation of As as a dopant has three possible choices of incorporation: (1) As substituted at an As site, which is fine; (2) As substituted at an Ga site, which is a deep level donor and not desirable but fine, and, (3) As incorporated interstitially in the lattice behaving as a shallow donor, which is preferred. Thus, all three possibilities for As are good because As substitutionally on its own site or interstitially are fine and the substitution at Ga sites forming As antisites gives rise to a deep donor and not a deep acceptor. The deep donor is also referred to as an EL2 center in GaAs and as a deep donor, it does not interfere with the n-type doping resulting from interstitial As atoms. Deep acceptors, if present to an appreciable extent, would compensate shallow donors provided by interstitial As sites and render the material useless. The density of shallow donor electrons close to the conduction band provided by interstitial As sites is quite adequate for HEMT applications.

There are many other possible candidates for n-type interstitial doping of III-V alloys. Lithium, for example, should lead to a shallow donor state, however, its mobility may be too high and it may gradually diffuse out of the sample. Calcium is another possibility and it should also lead to shallow donor states. Another possible candidate for an interstitial donor is Cu. It is known that Cu goes into GaAs interstitially and gives a shallow donor level. The problem with Cu appears to be that it tends to form defect complexes and its suitability for doping of high or moderate Al content $Al_xGa_{1-x}As$ alloys requires further examination.

Other examples of III-V semiconductors acceptable for interstitial doping as taught herein include GaAsP, GaAsSb and AlGaAsP, AlGaSb and GaInAsP alloys.

The introduction of Group III or Group V dopants in III-V semiconductors may be accomplished by several methods, such as high overpressure of the group III or Group V dopant in its gaseous form during MOVPE or MBE growth of the III-V semiconductor, ion implantation after crystal growth, and excess group V (or III) atoms in the melt during crystal growth.

The following are experimental examples of interstitial doping in III-V semiconductors according to the teachings of this invention. These particular examples are for the purpose of clarity of a method of introducing interstitial doping that may be employed in carrying out the the objects of this invention and is not intended nor should be construed to limit the invention to any particular form of incorporation or usage of a particular interstitial dopant because each particular III-V semiconductor and chosen interstitial dopant will require initial determination of parameters for the chosen method, such as growth temperature, overpressure, gas constituent ratios, ion implant energy, substrate temperature, etc.

Figure 3:
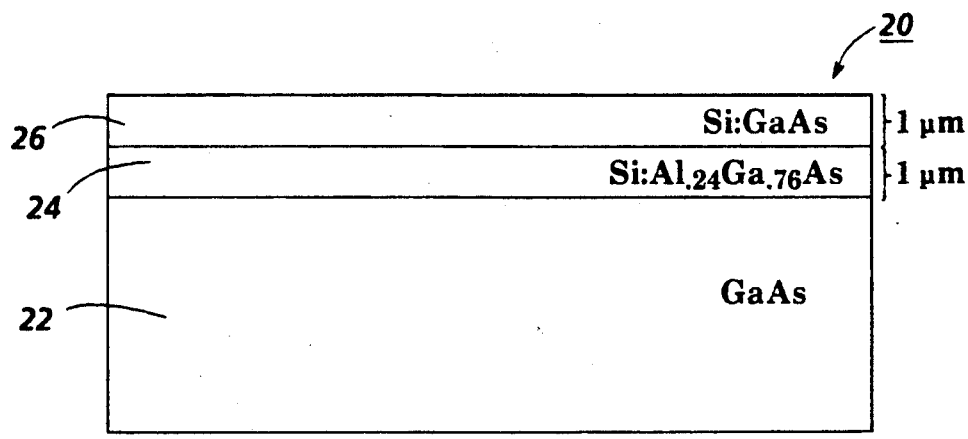
FIG. 3 is a schematic representation of a second of three samples fabricated and tested according to the teachings of this invention.
Figure 5:
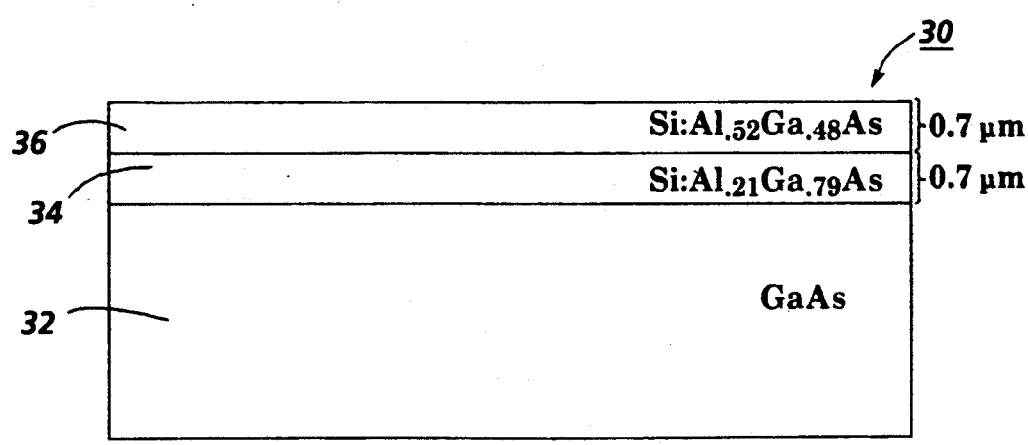
FIG. 5 is a schematic representation of a third of three samples fabricated and tested according to the teachings of this invention.

As shown in FIGS. 1, 3 and 5, three different samples 10, 20 and 30 were prepared in a conventional MOCVD growth system comprising an $Al_xGa_{1-x}As$ overlayer 16, 26 and 36 grown at a temperature of 820° C. on an intermediate $Al_yGa_{1-y}As$ layer 14, 24 and 34 with either a comparatively higher or significantly lower Al concentration, which, itself, was epitaxially deposited on a GaAs substrate 12, 22 and 32 at a temperature of 820° C. A high pressure ration between 80-90 of As/(Al+Ga) was used during the growth of both layers for each sample. During the growth of layers 14,16; 24,26; and 34, 36, Si was introduced into the MOCVD reactor for incorporation into these two consecutively deposited layers. In particular, in sample 10 of FIG. 1, underlayer 14 contain approximately 22% Al while overlayer 16 contained approximately 31% Al. In sample 20 of FIG. 3, underlayer 24 contain approximately 24% Al while overlayer 16 contained no Al, i.e., was deposited as GaAs. In sample 30 of FIG. 5, underlayer 34 contain approximately 21% Al while overlayer 16 contained approximately 52% Al. Thus, in samples 10 and 30, $x>y$ and $x>>y$, respectively, whereas in sample 20 $X=0$.

Figure 2:
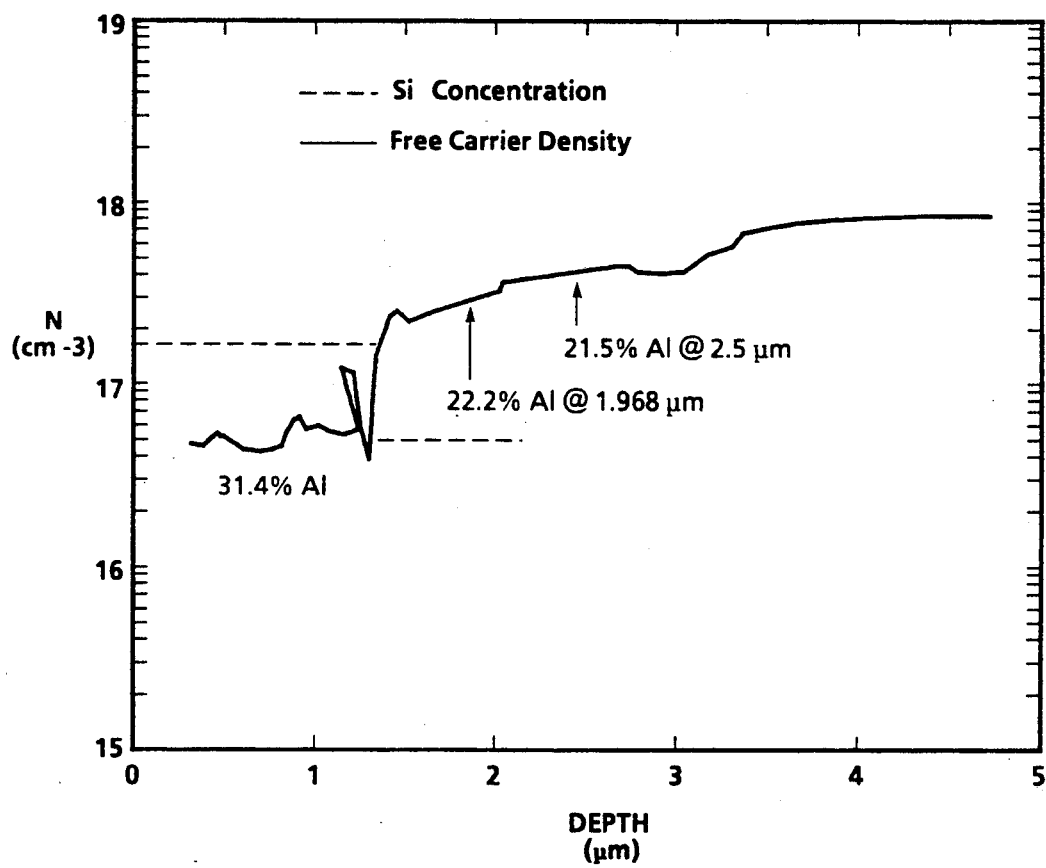
FIG. 2 is a graphic representation of free carrier concentration (solid line) and impurity concentration (dotted line) and versus sample depth for the first sample of FIG. 1.
Figure 4:
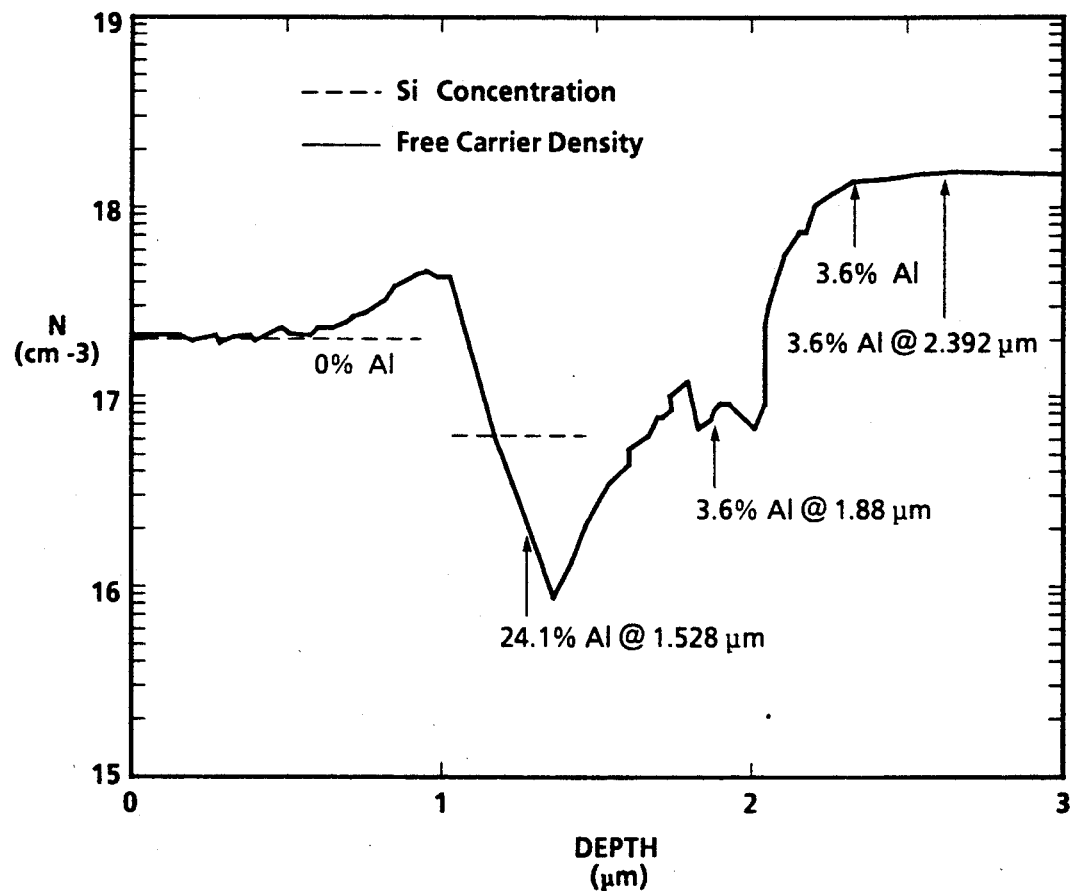
FIG. 4 is a graphic representation of free carrier concentration (solid line) and impurity concentration (dotted line) and versus sample depth for the second sample of FIG. 3.
Figure 6:
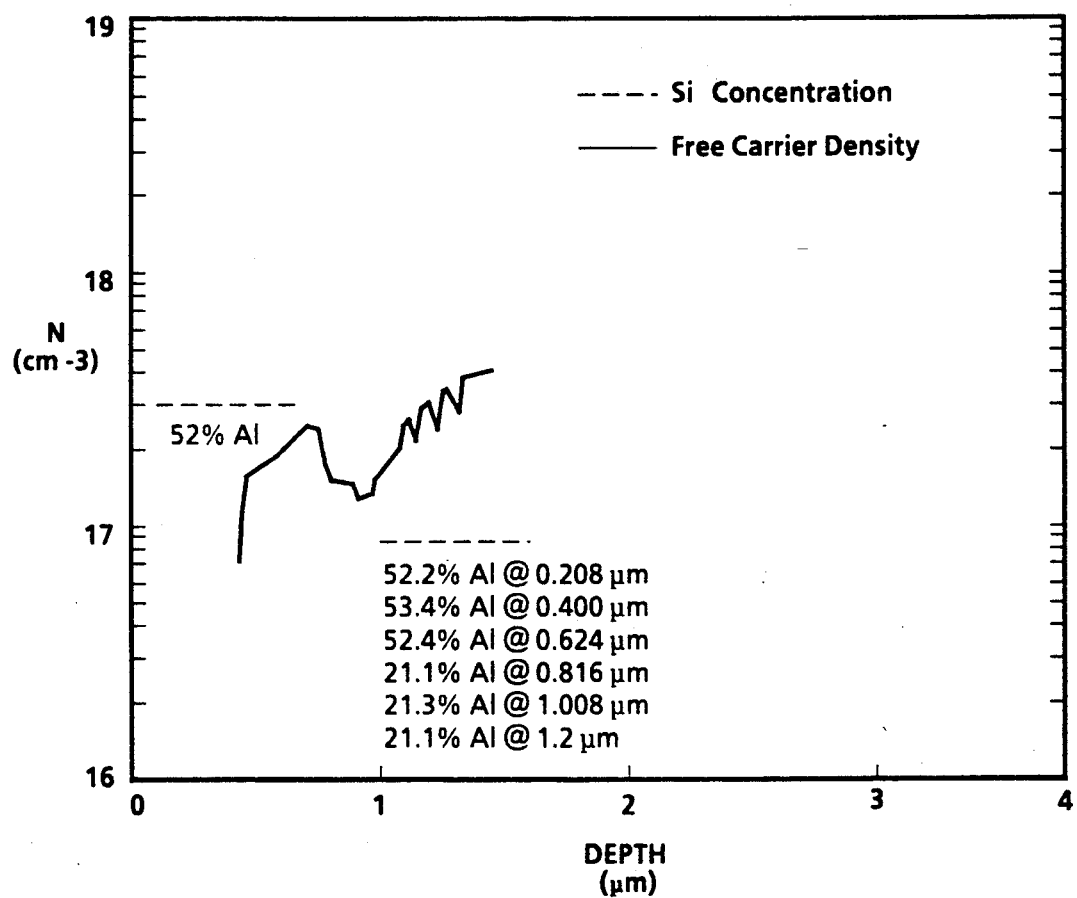
FIG. 6 is a graphic representation of free carrier concentration (solid line) and impurity concentration (dotted line) and versus sample depth for the third sample of FIG. 5.

Free electron concentrations on both the $Al_xGa_{1-x}As$ layers 16, 26 and 36 and $Al_yGa_{1-y}As$ layers 14, 24 and 34 were determined as a function of sample depth and a SIMS analysis was done to test any possible correlation of the free electron density with the concentration of Si impurities which were intentionally introduced during the growth phase. The results for each of the three samples 10, 20 and 30 is respectively disclosed in the graphs of FIGS. 2, 4 and 6 in solid line and dotted line. The concentration of free carriers as well as Si impurity is set forth on the same abscissa. The growth geometry permitted testing of interstitial doping hypothesis and its effect on the free carrier concentration.

For all three samples 10, 20 and 30, the variation of the free carrier concentration between the two different Al containing layers 14, 16; 24,26; and 34,36 cannot be explained by the Si content in these two different regions. More importantly, the free carrier concentrations predicted in one region by using the data in the other region are found to be consistent with the experimentally determined values. The prediction is based on the assumption of an equal concentration of As interstitial dopants in the two regions which is very reasonable because of the high growth temperature and the high mobility of As interstitial atoms at these temperatures. In the regions or layers of high Al content (x or y>22%), the free carrier concentration is predicted to be the difference between the As interstitial and Si concentrations since the Si atoms give rise to DX centers and trap the electrons supplied by the interstitial As atoms. In the regions or layers of low Al content (X or Y<22%), the free carrier concentration is equal to the sum of the concentrations of the Si and the As interstitial atoms. Since the Si concentration is known from SIMS and the free electron concentrations were determined via polaron doping profile measurements, the only unknown is the As interstitial concentration. From the foregoing, the experimental data may be used to determine the As concentration in one region and, then, since this interstitial concentration is the same in the other region, the carrier concentration in the latter region could be predicted and compared to the experimental value.

For sample 20 in FIG. 3, for example, the free carrier concentrations in region 26 is nearly equal to the Si concentration. Since the Al concentrations is zero in this region, there should be no deep trap states and the prediction that the free carrier concentrations should be equal to the Si plus the interstitial densities indicates that there are very few As interstitials in this sample. This leads to the prediction that the free carrier concentration in region 26 where the Al concentration is 26 should be very small because there are few As interstitials and because all the donor electrons from Si will be trapped on DX centers. The experiments verify this prediction and show a large drop in the free carrier density in region 26.

For sample 30 in FIG. 5, the free carrier density is approximately $10^{17}$ cm$^{-3}$ in region 36 where the AL concentration is high. This is about one third of the Si density. In region 36, however, the carrier density is significantly larger than the Si density because of the presence of As interstitials. The As interstitial density is predicated to be larger by at least $10^{17}$ cm$^{-3}$ than the si concentration in region 36, to give the observed free carrier density. This implies that the As interstitial density in region 36 (and, therefore, region 34) is about $3-4 \times 10^{17}$. In region 36 where the Si concentration is very low, the carrier density is nevertheless quite high. The theory predicts that the carrier density in this region should be equal to the As interstitial density in region 36 which is assumed to be the same as in region 34 plus the Si density in region 34. The experimental result confirm this prediction.

The data for all three samples 10, 20 and 30 examined provide very strong evidence for the feasibility and utility of the interstitial doping procedure employed thereby indicating clearly that the theory of DX center suppression leads to excellent predictions for high free carrier concentration. Carrier densities on the order of $5 \times 10^{16} - 3 \times 10^{17}$ per cm$^3$ were obtained in the Al containing regions 16 and 36 with Al concentrations of 31% and 52% Al, respectively.

II. Theory and Energetics of DX Center Formation in GaAs and Al$_x$Ga$_{1-x}$As Alloys The following scientific, theoretical and physical analysis is offered as additional support for this application, the contents of which analysis is to be published in a technical journal after the filing of this application. The experimental data set forth previously for the three samples in Part I supports the conclusions reached in this analysis.

The following is a more detailed discussion of the results of the theoretical study of the atomic and electronic structure of DX centers in GaAs and AlGaAs alloys. The approach to the problem of the DX center is presented in two complementary ways. In Section A, a simple expression for the composition and pressure dependence of the binding energy of DX centers in AlGaAs alloys is proposed. The major conclusion drawn from this analysis is that the much discussed correlation between the DX and L conduction-band-minimum energies can be satisfactorily explained without the assumption that DX is an L-derived effective-mass like level.

In Section B the structural, energetic, and electronic aspects of Si and S induced DX centers in GaAs is addressed using an ab initio self-consistent pseudopotential approach. The results of these calculations indicate that DX is a strongly localized and negatively charged defect which behaves as a negative-U center. The calculated atomic structure for DX is shown to be characterized by a very large dopant-dependent lattice relaxation. In addition, the large Stokes shift between the thermal and optical binding energies, and the barriers for electron capture and emission are shown to be properly accounted for by the predicted structural models for Si and S induced DX centers.

The results of the previous two sections are used in Section C to suggest that: The formation of DX centers is associated with structural transformations which are specific to substitutional donors and unlikely to occur for interstitial donors. The experimental results on a reduction in DX concentration in the samples reported in Part I, achieved through the preparation technique of As overpressure is concluded to be caused by an unanticipated formation of a large number of interstitial donors. The advantages and disadvantages of using particular interstitial dopants are examined. A summary of the main results of this analysis is given in Section D.

A. Thermal Binding Energy of DX Centers

1. Charge State of DX Centers

In the nondegenerate doping limit, the DX center is proposed to result from the following set of reactions:

$$d^0 \rightarrow d^+ + e \qquad (1)$$

which costs only $\approx 6$ me V, and $$d^0 + e \rightarrow DX^- \qquad (2)$$

which involves the capture of a free electron. The two reactions add up to give:

$$2d^0 \rightarrow d^+ + DX^-. \qquad (3)$$

Figure 7A:
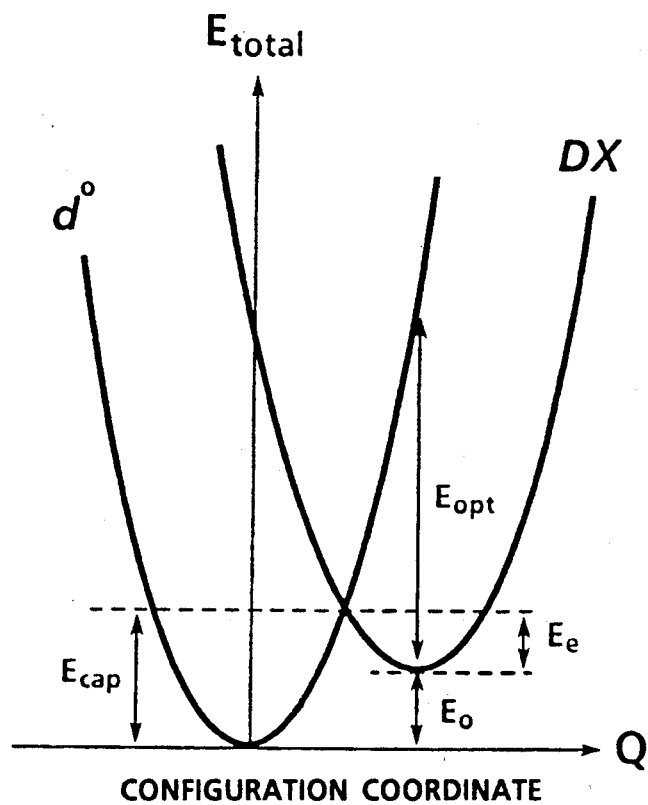
FIGS. 7A and 7B are configuration coordinate diagrams for DX centers respectively in GaAs and typical AlGaAs alloys.
Figure 7B:
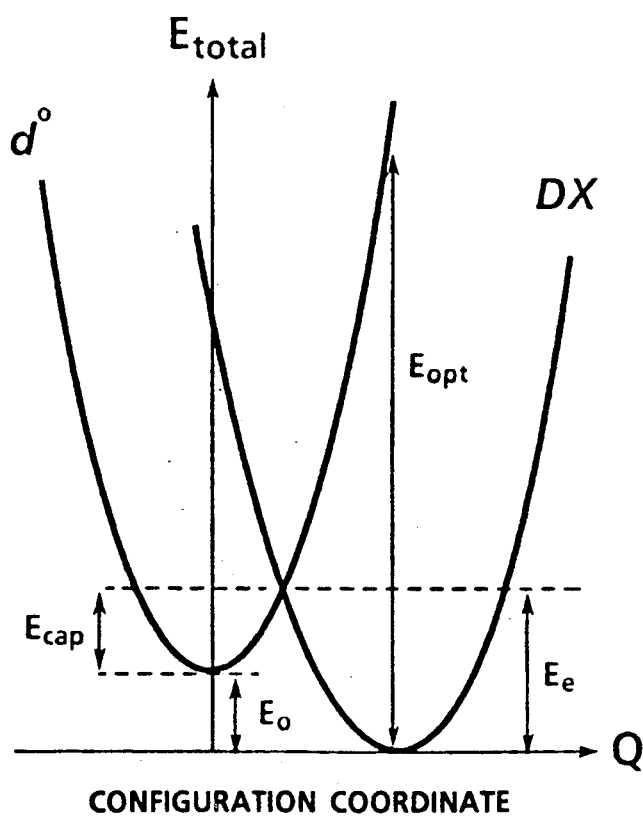
Figure 8C:
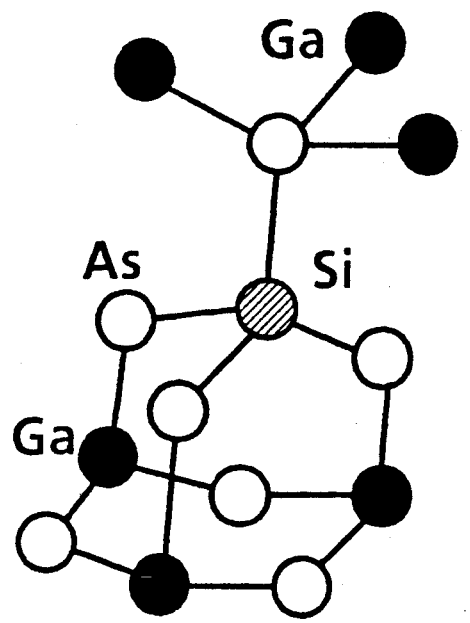
Figure 8C:
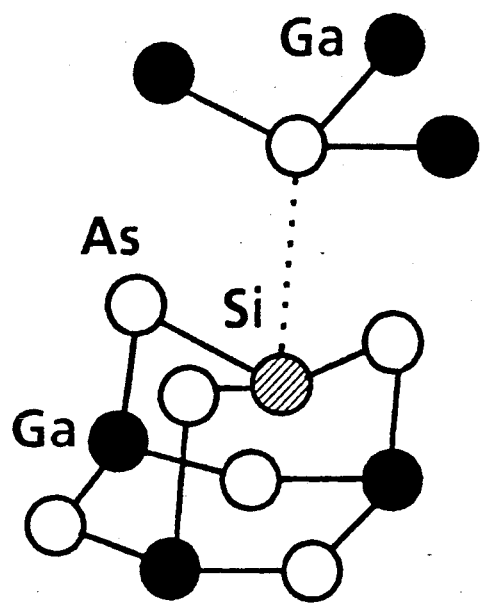
Figure 8C:
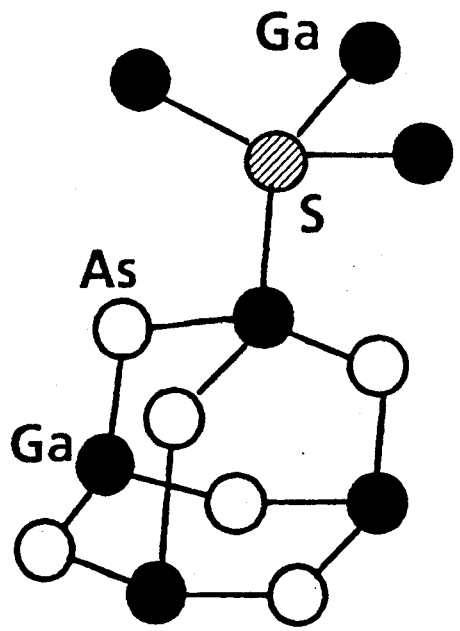
Figure 8D:
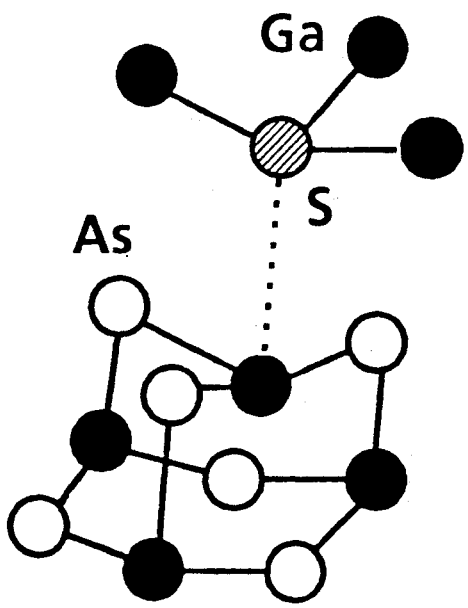

In Eqs. (1)–(3) d represents a normal fourfold coordinated substitutional donor, DX denotes the broken bond configurations shown in FIGS. 7A and 7B, e denotes a free electron in the conduction band, and the superscripts specify the charge states. The neutral donors in Eq. (3) are not necessarily in close spatial proximity of each other to form DX$^-$. Equation (3) indicates that the density of DX centers should, at most, equal one half the density of the donor atoms. This will hold if there is no other shallow donor which is itself stable against a DX-like transformation but which can act as a reservoir to supply the free electrons needed to drive the donors in Eq. (3) into the DX state. As discussed in Section B, the energies of both the DX$^0$ and DX$^+$ states are found to be significantly larger than those of d$^0$ and d$^+$ and there is no energy barrier for the transformations between the structures. This is the reason why the reaction in Eq. (3) is not written in the form $2DX^0 \rightarrow DX^+ + DX^-$.

In highly doped samples where the electrons form a degenerate gas and the donors are nearly all ionized, DX formation may occur from the capture of two electrons by an ion:

$$d^+ + 2e \rightarrow DX^-. \qquad (4)$$

The atomic distortions responsible for the formation of DX involve a large lattice displacement which leads to the breaking of a donor-lattice bond. The notation DX is used herein to refer to the broken-bond configurations disclosed in FIGS. 8A-8D. The consequences of Eqs.

(1)–(4) for the properties of DX centers are analyzed in the following sections. The dependence of the binding energy of DX centers on alloy composition, pressure, and dopant concentration as a function of its charge state is examined below.

2. Binding Energies of $DX^0$ and $DX^-$ Centers

A more detail examination of the simple expression for the thermal binding energy $E_0$ of DX centers will now be considered, having been recently suggested in Chadi et al., *Physical Review Letters*, Vol. 61, p. 873 et seq., August, 1988. For a neutral center the binding energy $E_0(DX^0)$ relative to the conduction band minimum (CBM) in $Al_xGa_{1-x}As$ alloys was proposed to vary with alloying as $$\Delta E_0(DX^0) = \Delta E_{CBM} - \Delta E_{CB} \qquad (5)$$

where $E_{CBM}$ is the energy of the CBM and $E_{CB}$ is the average over the Brillouin zone (BZ) of the energy of the lowest conduction band, both energies being measured relative to the valence band maximum (VBM). The idea underlying Eq. (5) is that DX is a localized defect, whose wave function is derived equally from all the states of the lowest conduction band. As a result the variation of its thermal occupancy level, $\Delta E_{DX^0}$, relative to the VBM is given by $$\Delta E_{DX^0} \approx \Delta E_{CB}. \qquad (6)$$

In writing Eq. (6) we are implicitly assuming that the impurity potential is not strong enough to cause a mixing of the higher lying conduction bands. Exceptions to Eq. (6) can arise when the difference between the potentials of the host and impurity atoms is sufficiently large to cause an appreciable mixing of other conduction (or possibly valence) bands. The symmetry of the deep center may also play an important role in determining the actual mix of the conduction band states.

The assumption that DX is derived equally from all the states of the lowest conduction band implies:

$$\Psi_{DX} \approx \sum_k e^{ic(k)} \Psi_k \qquad (7)$$

where $\Psi_k$ is a Bloch function solution of the periodic lattice for the first conduction band with wave vector k and c(k) is an arbitrary real number. This expression for $\Psi_{DX}$ is reminiscent of the definition for a Wannier function $w(r-R)$ localized at site R of the lattice:

$$w(r - R) = \sum_k e^{ik \cdot R} \Psi_k \qquad (8)$$

If the values of the c(k) are known, we can define new Bloch functions $\phi_k = \exp[ic(k)]\Psi_k$ which include the phase factors $\exp[ic(k)]$ in their definition and then construct new Wannier functions according to Eq. (8) with $\Psi_k$ replaced by $\phi_5$. For this special case, $\Psi_{DX}$ is equal to the Wannier function centered at the origin. For the general case, however, $\Psi_{DX}$ is a linear combination of Wannier functions localized at various sites.

Figure 9:
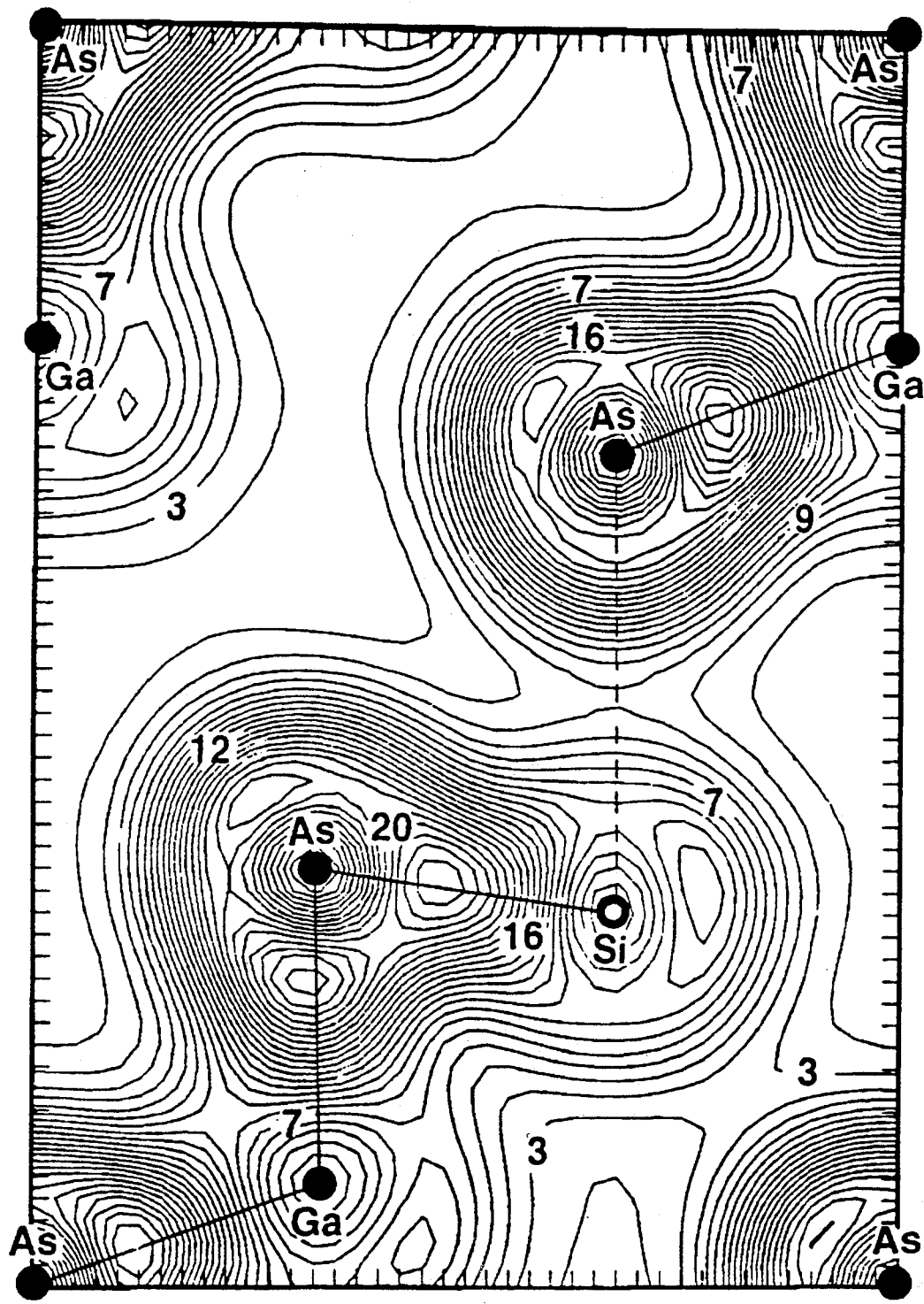
FIG. 9 is a representation of the total valence electronic charge density of GaAs including the contribution from the fully relaxed Si induced $DX^-$ center in a $[1\bar{1}0]$ plane with the broken Si-As bond indicated as a dashed line.
Figure 10:
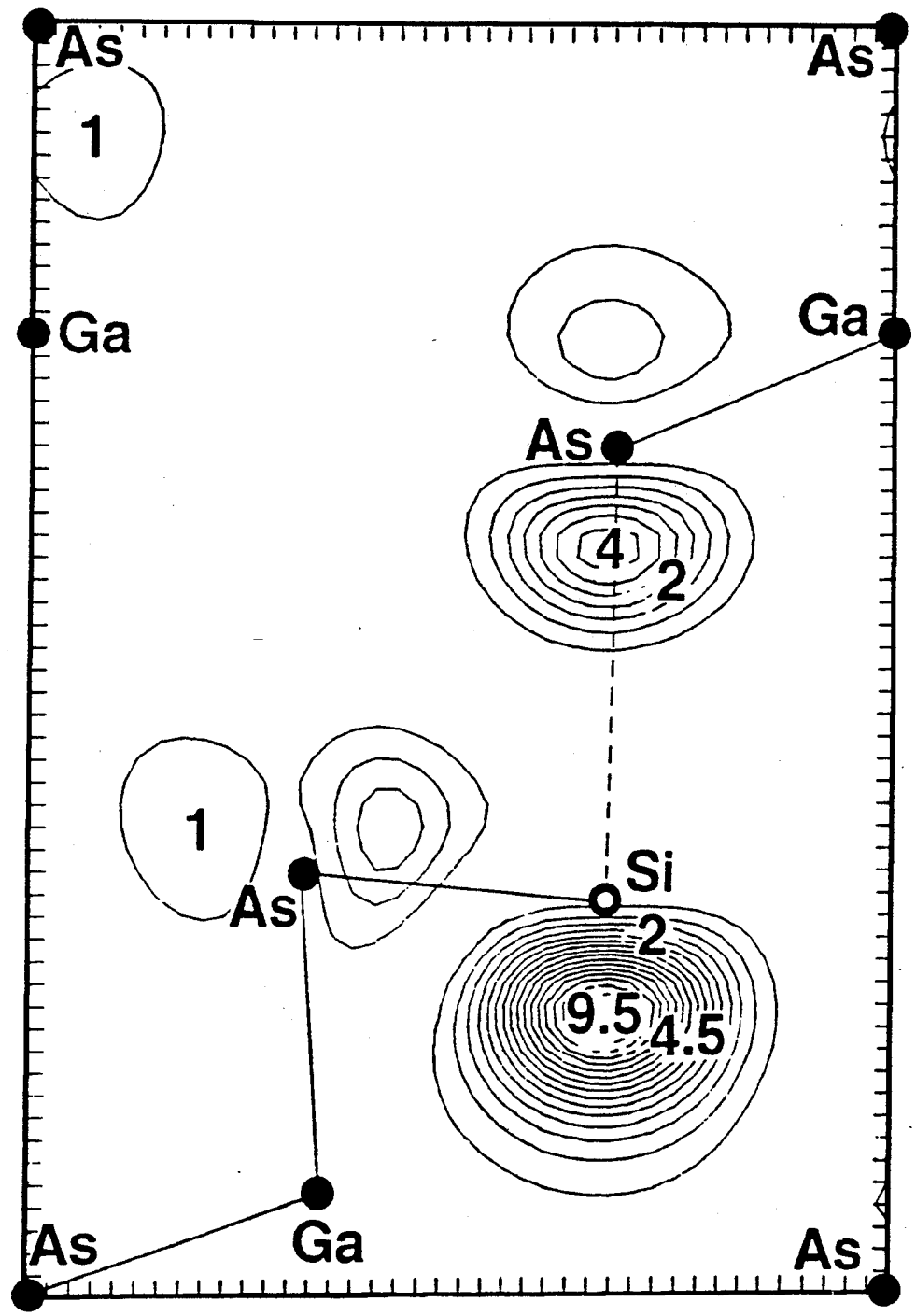
FIG. 10 is a representation of the total electronic charge density for the state associated with the $DX^-$ center for Si doped GaAs with the broken Si-As bond indicated as a dashed line.
Figure 11:
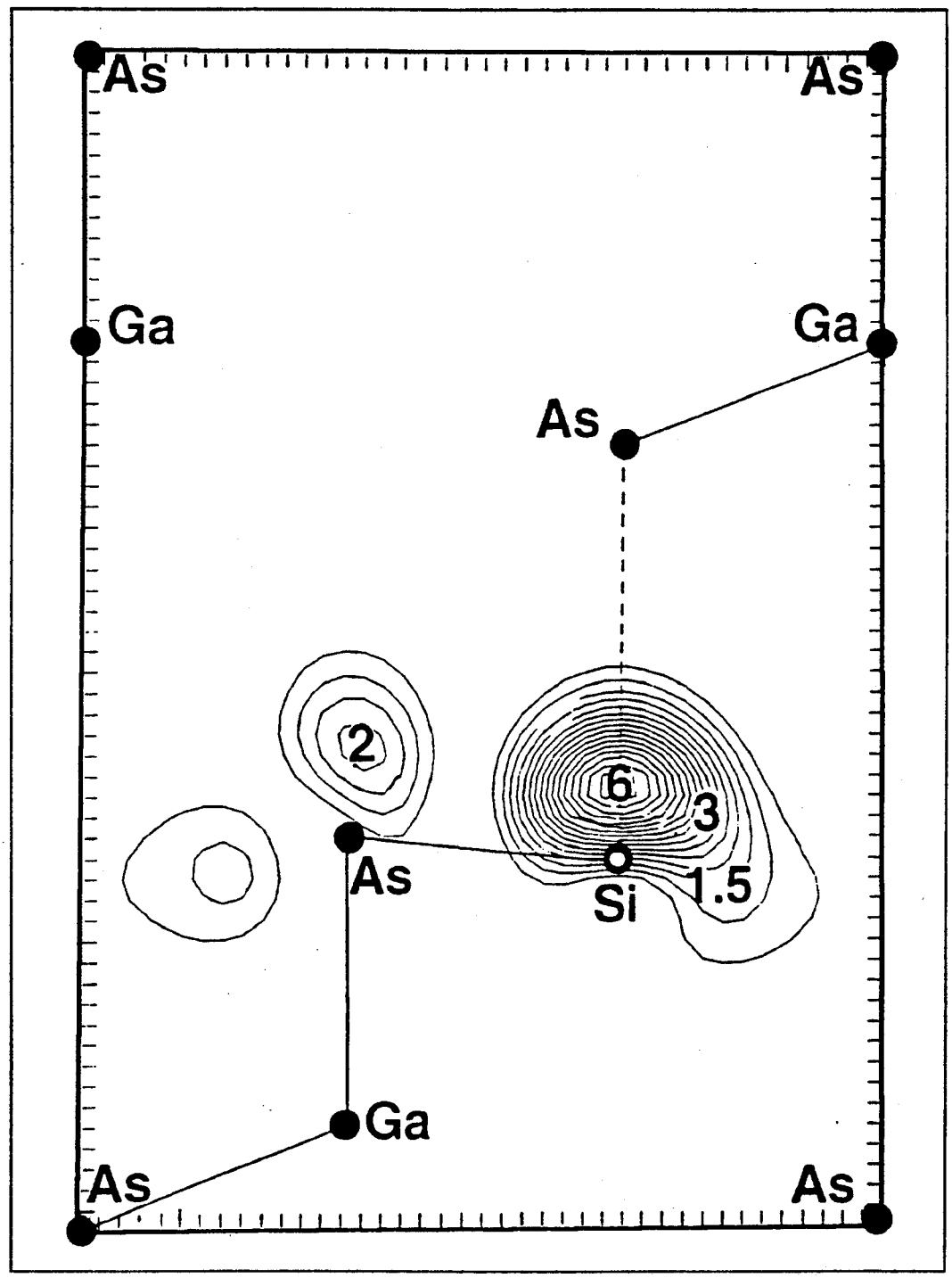
FIG. 11 is a representation of the total electronic charge density associated with the lowest empty state associated with the $DX^-$ center for Si doped GaAs with the broken Si-As bond indicated as a dashed line.

The energy of the neutral DX center for the particular choice of wave function made in Eq. (7) is given by:

$$E_{DX^0} = E_{CB} + \langle \Psi_{DX} | U | \Psi_{DX} \rangle, \qquad (9)$$

where $E_{CB}$ is the BZ-averaged energy of the first conduction band and U is the perturbation potential introduced by the impurity. Since $\Psi_{DX}$ is very localized, the last term in Eq. (9) is a measure of the central cell contribution to the energy of DX. The consistency of Eqs. (6) and (9) requires that the variation of this term with alloying should be small. These results for the charge density of the Si-induced DX center in GaAs are illustrated in FIGS. 9–11 and suggest that this should be a satisfactory approximation because of the highly localized nature of the charge distribution. Experimentally, the local atomic environment is observed to make a small but measurable difference in the energy of the DX center.

The BZ average of the conduction band energy needed to determined $\Delta E_{CB}$ in Eq. (6) can be carried out in a number of ways. The most direct method is to use a fine mesh of points in reciprocal space for the averaging. As much simpler approach is to use the "special points" approach which relies on a few well chosen representative points. The hierarchy of the special point sets for fcc Bravais lattices appropriate for GaAs and AlGaAs alloys has been previously determined. The desired average can be determined with high accuracy as the number of special points used in the sampling is increased. A zeroth order approximation to the average energy is $\Delta E_{CB} \approx \Delta E(L)$. A more accurate approximation, which is discussed in the Appendix, is obtained by using the energies at the $\Gamma$, X, and L points according to the prescription $$\Delta E_{CB} \approx \Delta[E(\Gamma) + 3E(X) + 4E(L)]/8. \qquad (10)$$

This is a very convenient formula for determining $\Delta E_{CB}$ since the variations in the band edge energies with alloying, pressure and temperature are well known. The variations of the band edges in $Al_xGa_{1-x}As$ alloys are nearly linear in x, for $x \leq 0.6$, and at room temperature are given (in eV) by:

$$E(\Gamma) \approx 1.42 + 1.25x, \qquad (11)$$

$$E(X) \approx 1.90 + 0.21x, \qquad (12)$$

and, $$E(L) \approx 1.71 + 0.64x. \qquad (13)$$

The variation with alloying of the BZ averaged energy of the lowest conduction band obtained from Eqs. (10)–(13) is given by $$\Delta E_{CB} \approx 0.55\Delta x. \qquad (14)$$

The three point $\Gamma$, X, L averaging gives a variation of $E_{CB}$ with x which is only 86% of the rate of the corresponding change of E(L) instead of being equal to it when the zeroth order approximation $\Delta E_{CB} \approx \Delta E(L)$ is used.

Equations (11)–(13) show that the CBM is at $\Gamma$ for $x \leq 0.46$ and at the X point of the BZ for $x > 0.46$. Equations (5)–(14) therefore predict:

$$\Delta E_0(DX^0) = 0.7 \Delta x \; ; \; x \leq 0.46, \qquad (15)$$

and, $$\Delta E_0(DX^0) = -0.34\Delta x \; ; \; x > 0.46. \qquad (16)$$

For a negatively charged center arising from Eq. (3) we need the variation of the energy of $DX^- + d^+$ relative to $2d^0$. Using the same approach as above, this difference is equal to:

$$\Delta E_0(DX^-) = 2\Delta(E_{CBM} - E_{CB}) \quad (17)$$
$$= 2\Delta E_0(DX^0).$$

For a neutral center the densities of $d^0$ and $DX^0$ are related by $$n_{d^0} = n_{DX} \exp[-\beta E_0(DX^0)]. \quad (18)$$

where $\beta = 1/kT$ and T is the absolute temperature. For the $DX^-$ center, however, it is $\frac{1}{2}E_0(DX^-)$ that enters the Boltzmann factor giving the relation between the densities of $d^0$ and $DX^-$ centers. The reaction specified by Eq. (3) suggests that $$(n_{d^0})^2 = n_d + n_{DX^-} \exp[-\beta E_0(DX^-)] \quad (19)$$

where $n_i$ denotes the density of species i. When $n_{d^+} \simeq n_{DX^-}$, Eq. (19) gives:

$$n_{d^0} = n_{DX^-} \exp[-0.5\beta E_0(DX^-)]. \quad (20)$$
$$= n_{DX^-} \exp[-\beta E_0(DX^0)].$$

The ratio $n_{d^0}/n_{DX}$ determined from Eqs. (18) and (20) is independent, therefore, of the charge state of DX. The experimentally derived binding energies[13] which are based on a $\beta \Delta E_0$ dependence in the Boltzmann factor need to be multiplied by two for a negatively charged state. In the following, in order to compare the predictions of the simple model with the experimental data of Chand et al., *Physical Review B*, Vol. 30, p. 4481 et seq., 1984, the expressions for $\Delta E_0(DX^0)$ given by Eqs. (15) and (16) are used. The factor of two difference between $\Delta E_0(DX^0)$ and $\Delta E_0(DX^-)$ state should be borne in mind, however.

Equations (15)–(16) show that the binding energy of DX relative to the CBM increases with Al concentration until the direct-indirect band gap transition at $x \simeq 46\%$ and then it decreases. The predicted extremum of $x \simeq 46\%$ for the DX binding energy is in good agreement with the experimentally determined range of $0.45 \leq x \leq 0.48$. The 0.7 eV prefactor in Eqs. (15) for $x < 0.46$ is nearly identical with the 707 meV value obtained by Chand et al. from a best fit to their data. The variation above $x = 0.46$ is also in very good agreement with experimental data.

Equations (6), (13), and (14) show that the thermal occupancy level $E_{DX}$ relative to the VBM varies as if it is tied to the L point of the conduction band. The correlation between the motion of the two, as measured by the ratio of the coefficients of $\Delta x$ in Eqs. (13) and (14), is $0.55/0.64 \simeq 86\%$. This is very nearly the same as the measured correlation coefficient of $0.54/0.64 \simeq 84\%$. The derivation of this result makes it clear, however, that: The L-like variation of the DX energy can be explained without the assumption that it is an L-derived effective mass level. The correlation between $E_{DX}$ and E(L) appears because $\Delta E_{DX} \simeq \Delta E_{CB}$ and $\Delta E_{CB} \simeq \Delta E(L)$. If DX were an L-derived effective mass level, then $\Delta E_{DX}$ would have to be exactly, and not merely approximately, equal to $\Delta E(L)$. Such an exact relationship between the DX and E(L) energy levels has not been experimentally established. In addition, an L-derived level, even when inter-valley scattering is accounted for, is a much more delocalized defect than is experimentally observed to be the case for DX. Since the special points derived relation $\Delta E_{CB} \simeq \Delta E(L)$ is material independent, the correlation $\Delta E_{DX} \simeq \Delta E(L)$ is not restricted to AlGaAs alloys but should hold approximately in other materials.

Other expressions for the alloy dependence of the band energies have been discussed by T. N. Theis, in *Proceedings of the Third International Conference on Shallow Impurities in Semiconductors*, Aug. 10–12, 1988, Linköping, Sweden (in press) and D. E. Aspnes, in *Gallium Arsenide*, Edited by J. S. Blakemore, American Institute of Physics No. 1, pp. 231–243, 1987. For the new parametrization schemes one also finds that the use of $\Delta E_{DX} \simeq \Delta E_{CB}$ together with the three point averaging scheme of Eq. (10), results in $\Delta E_{DX} \simeq 0.84 \Delta E(L)$ or $\Delta E_{DX} \simeq 0.77 \Delta E(L)$. This shows that $E_{DX}$ is, for all reasonable parametrizations, most strongly correlated with E(L).

The $\Gamma$, X and L averaging scheme can also be used to determine the temperature dependence of the DX binding energy since the shifts of the energies of the band edge states with temperature are well known, particularly for GaAs. The temperature shifts of the $\Gamma$, X, and L conduction states with respect to the VBM have the same sign and are nearly equal to each other in GaAs. This implies that $E_0(DX^0)$ in GaAs should be approximately temperature independent.

3. Pressure Dependence of the DX Binding Energy

Making use of the experimental result that at $x \simeq 0.22$ the thermal binding energy of DX becomes equal to that of shallow donors ($\simeq 6$ meV), the integration of Eqs. (15) and (17) gives (in eV):

$$E_0(DX) = (0.7x - 0.15)(1+q) \quad ; \quad x \leq 0.46, \quad (21)$$

where q assumes the values of 0 or 1 for $DX^0$ and $DX^-$ respectively. Equation (21) predicts that DX is unbound (or metastable) by $0.15(1+q)$ eV in GaAs. From Eqs. (5) and (17) a charge state independent increase of 0.15 eV to 0.17 eV (depending on the extrapolation used) in $(E_{CBM} - E_{CB})$ is needed to stabilize DX in GaAs. One method for inducing this increase is through the application of pressure. The pressure dependence of $E_0(DX)$ can be easily calculated under the assumption that the contribution of the last term in Eq. (9) to the pressure coefficient is small. The pressure coefficients of the conduction band states at the $\Gamma$, X, and L points for GaAs are well known and, in meV/kbar, are equal to:

$$\delta E(\Gamma)/\delta P = 12, \quad (22)$$

$$\delta E(X)/\delta P \simeq -1.6; \quad (23)$$

and, $$\delta E(L)/\delta P = 5.5 \, , \quad (24)$$

therefore, the pressure dependence of $E_{CB}$ evaluated using Eq. (10) is $$\delta E_{CB}/\delta P \simeq 3.6 \, , \quad (25)$$

and $$\delta[E(\Gamma) - E_{CB}]/\delta P \simeq 8.4 \, . \quad (26)$$

The required 0.15–0.17 eV increase in $[E(\Gamma) - E_{CB}]$ needed to stabilize the DX center in GaAs translates to a pressure of 18–20 kbar. This result is consistent with experimental data, for example, see M. Mizuta et al., supra, which show the appearance of DX centers in GaAs at pressures of about 20–30 kbars. In the direct gap region, the calculated pressure coefficient $\Delta E_0(DX)/\Delta P$ of 8.4 meV/kbar is consistent with the experimentally determined values from pressure and temperature dependent Hall measurements in GaAs and $Al_{0.15}Ga_{0.85}As$ and with other recent measurements which give values in the range of 6 to 7.5 meV/kbar. In the indirect gap regime the pressure coefficient $\Delta E_0(DX)/\Delta P$ is calculated to be $-5.2$ meV/kbar. The change in sign of the pressure coefficient and its magnitude are also consistent with recent experimental results.

4. Fermi Level Pinning Position in Heavily Doped GaAs

If DX were a neutral center resulting from the reaction $$d^+ + e \rightarrow DX^0 \tag{27}$$

then the probability that an electron would have the minimum energy necessary to form a DX center would be given by $$f(E_{DX^0}) = \{1 + \exp\beta(E_{DX^0} - E_F)\}^{-1} \tag{28}$$

where $E_F$ is the Fermi energy. At low temperatures where $\beta(E_{DX^0} - E_F) \gg 1$ the stabilization of $DX^0$, relative to free electrons at $E_F$, would require a rise in $E_F$ of approximately 0.15 eV relative to the CBM in GaAs, according to Eq. (21). The DX centers would in fact lead to a pinning of the Fermi energy at 0.15 eV above the CBM because they would become energetically as favorable as the free electron states at this value of $E_F$. The variation of the DX concentration as a function of the dopant density and, therefore, as a function of $E_F$ has been determined by T. N. Theis et al., *Physical Review Letters*, Vol. 60, p. 361 et al., 1988. From their experiments they conclude that $E_{DX}$ lies $\approx 0.28$ eV above the CBM in GaAs. This is nearly twice the value for a neutral center suggested by Eq. (21) from an extrapolation of the alloy composition dependence of the $DX^0$ binding energy to GaAs. The experimental results on the Fermi level pinning position may appear, at first, to agree with the prediction of Eq. (21) for a negatively charged DX center. However, the two electron reaction given by Eq. (4) suggests that the required minimum energy per electron to form a $DX^-$ center is only one half as large as $E_0(DX^-)$ and should be equal to 0.15 eV as in the case of the neutral center. This implies that $E_F$ should be pinned at 0.15 eV above the CBM, independent the charge state of the DX center. An explanation for the experimentally observed higher pinning position of $E_F$ is provided below.

The energy of the DX resonance above the CBM is experimentally observed to increase slightly with dopant density in the high doping regime in GaAs. A very small increase ($\approx 1$ meV) in the DX energy is expected from Eq. (7) when the sum over the conduction band states is restricted to be over only the unoccupied states. This is due to the fact that even at the highest doping levels,[9,10] e.g., $n_0 = 1.8 \times 10^{19}$ cm$^{-3}$, the volume of k-space occupied by the free electrons is extremely small.

The shifting of $E_{DX}$ with respect to the CBM is mainly due to band gap renormalization in heavily doped semiconductors resulting from the Coulombic interactions between the electrons. One effect of this renormalization is a lowering of the energies of the states near the $\Gamma_1$ conduction band which will show up as an effective increase in the position of the DX level with respect to the CBM. The approximate size of the reduction in the energy of the $\Gamma_1$ state is given by $$\Delta E(\Gamma_1) = -\frac{2e^2 k_F}{\pi \epsilon} - \frac{e^2 \lambda}{2\epsilon}\left[1 - \frac{4}{\pi}\tan^{-1}\left(\frac{k_F}{\lambda}\right)\right] \tag{29}$$

where $k_F = (3n^2 n_0)^{\frac{1}{3}}$ is the Fermi wave vector of the electrons in the conduction band, $\epsilon$ is the dielectric constant of the material ($\epsilon \approx 10.9$ for GaAs), and $\lambda = (6\pi n_0 e^2/\epsilon E_F)^{\frac{1}{2}}$ is the Thomas-Fermi screening parameter. For the case of highly doped GaAs where $n_0 \approx 1.8 \times 10^{19}$ cm$^{-3}$ and $E_F$ is 0.28–0.29 eV above the CBM, the first term in Eq. (29) gives a downward shift of the conduction band of about 68 meV while the other terms in the bracket give an upward shift of 11 meV. The total shift of 57 meV provides a partial explanation for why the measured pinning position of the Fermi level in GaAs is at a higher energy than the 0.15 eV value extrapolated from the binding energy in AlGaAs alloys. Another factor affecting how high $E_F$ can be raised without creating Dx centers is the attractive interaction of the ionized d+ impurity centers with the conduction electrons which lowers the energy of these centers. The magnitude of this correction is not precisely known at this time. A rough estimate for this term can be obtained from the expression $$\Delta E \approx -\frac{4\pi e^2}{\epsilon}\int_0^R n(r)\frac{1}{r}r^2 dr = -\frac{3e^2}{2\epsilon R} \tag{30}$$

where the electron charge distribution $n(r) = n_0$ is assumed to be uniform and R is determined from the relation $n_0 = (4\pi R^3/3)^{-1}$. The screening of the impurity by the electrons in the first conduction band is left out of Eq. (30) because the Coulombic interaction between these electrons is accounted for in Eq. (29). The attractive term in Eq. (30) is counterbalanced by a repulsive impurity-impurity interaction which is approximately equal to $+e^2/\epsilon R$. For $n_0 = 1.8 \times 10^{19}$ cm$^{-3}$, $R \approx 23.7$ Å and the impurity-conduction-electron interaction in Eq. (30) together with the impurity-impurity interaction gives a correction of nearly 28 meV to the stability of the fourfold coordinated d+ impurity centers. In the highly doped materials, there is an additional contribution similar to that in Eq. (30), but with opposite sign, affecting the stability of a negatively charged DX center. For this case the screening of the $DX^-$ center by the free electron gas, which is not accounted for in Eq. (29) needs to be included in Eq. (30). Using $e^{-r}/r$ instead of a $1/r$ potential in Eq. (30), the repulsive DX-conduction-electron interaction is calculated to be 46 meV at an electron density of $n_0 = 1.8 \times 10^{19}$ cm$^{-3}$ and an $E_F$ of 0.29 eV. The three corrections: 57 meV from the lowering of the conduction band energy, 28 meV from the electron-impurity and impurity-impurity potentials, and 46 meV from the $DX^-$-conduction electron interaction, together amount to 130 meV which is sufficient to provide an explanation for why the observed Fermi level pinning position with respect to the CBM in heavily doped GaAs samples is ≈0.14 eV higher than the 0.15 eV value expected from an extrapolation of the DX binding energy in AlGaAs alloys to GaAs. For a neutral DX center, the pinning position would be only 0.57+28 or 88 meV higher than the expected 0.15 eV above the CBM.

B. Results of Ab Initio Pseudopotential Calculations

A brief description of ab initio self-consistent calculations for Si and S substitutional donors in GaAs is set forth in Chadi et al., supra, in Section A2. The calculations for the $d^0$, $d^+$, $DX^0$, $DX^+$, and $DX^-$ structural states were each done separately using an 18 atom $\sqrt{3} \times \sqrt{3} \times \sqrt{6}$ hexagonal supercell with its c-axis oriented along the [111] axis. The unit cell although relatively small is still sufficiently large to provide reliable information on the structural properties of DX centers. The same unit cell was used in our previous study of the EL2 defect center in GaAs. The results obtained in that case for the charge density distributions and structural properties of the antisite were found to be in good accord with a similar calculation employing a 54 atom cell. For the present study, the band dispersion of the donor state from the zone center to the Brillouin zone edge, resulting from the use of a finite sized cell, is calculated to be 0.2 eV. The local phonon vibration mode for the Si on Ga-site donor is calculated to be nearly 334 cm$^{-1}$ as compared to the experimental values of 379-384 cm$^{-1}$. Our calculations indicate that the mode is quite anharmonic.

The optimal atomic coordinates were determined by minimizing the totalenergy. Hellmann-Feynman forces were calculated and utilized in the optimization process. Our calculations show that a neutral donor is stable against Jahn-Teller distortions in GaAs. The major result of our calculation is, however, that a metastable state with a large lattice relaxation leading to a broken bond configuration (FIG. 2) and a $C_{3v}$ symmetry, is possible for a negatively charged center. As discussed below, this center has many of the properties associated with the DX center. For a Si donor, the distortion leading to DX formation involves a 1.17 Å motion of the Si atom away from one of its nearest neighbor As atoms, along the bond axis, into a threefold coordinated interstitial position. The bonding configuration for the Si atom changes from sp$^3$ to sp$^2$ as a result of the relaxation. This is best seen by the 118.4° angles about the Si atom in the interstitial configuration. The threefold coordinated As atom resulting from the Si displacement relaxes outward, reducing its angles from 109.47° to 106.5°. Electronic charge is transferred from the Si atom to the As atom in this process. Maximal bond-length changes of −2.4% between Ga and As atoms near the Si donor are found. For a S donor one of the nearest-neighbor Ga (or Al) atoms of the S dopant moves by 1.13 Å into an interstitial position. A sulfur-gallium bond is broken as a result of this relaxation. The bond angles about the threefold coordinated Ga (or Al) atom are calculated to be 118.3° and those around S about 112°. Maximal bond-length changes of +2.8% between Ga and As atoms are found for this case. The valence electron charge density for a Si induced DX$^-$ center is shown in FIG. 9. The atomic distortions in FIG. 10 are nearly identical to those predicted to occur in the metastable state of the EL2 related As$_{Ga}$ antisite defect in GaAs.

The reaction represented by Eq. (3) is calculated to be energetically unfavorable by 0.22±0.1 eV for both Si and S donors in GaAs. The surprisingly small value of the total-energy differences and the near equivalence of the results for Si and S are in qualitative agreement with the ≈0.3 eV estimate from Eq. (21). When the charge of the DX$^-$ center is changed to DX$^0$ or DX$^+$ the interstitial atomic configuration is found to be highly unstable with respect to the ordinary fourfold coordinated substitutional geometry and there is no barrier for the transformations to this geometry. The DX$^0$ to $d^0$ transition is calculated to be exothermic by ≈1.3 eV.

The threefold symmetric $C_{3v}$ structure proposed for the DX center is in agreement with the experimentally derived symmetry from phonon transmission measurements. These experiments show a trigonal symmetry for Sn-doped samples and an orthorhombic or trigonal symmetry for Te doped ones. Other experiments based on analyses of extended X-ray absorption fine structure (EXAFS) have also provided information on the local atomic environment of DX centers. The EXAFS results of Sette et al., *Physical Review Letters*, Vol. 56, p. 2637 et seq., 1986, for S-doped GaAs show that there are two types of atomic environments around the S atoms.

One-half the S atoms are found to be in their normal substitutional positions but the local environment of the other half is found to be severely distorted. This picture is in good agreement with predictions for S-induced DX centers. However, Mizuta et al., *Applied Physics Letters*, Vol. 52, p. 126 et seq., 1987, using the same technique infer a very small lattice relaxation for the case of Se. More recently Mössbauer spectroscopy has been applied to Sn doped samples and the results seem to indicate a significant local distortion of atoms around Sn.

Calculations show that although the Si and S induced DX$^-$ centers in GaAs are metastable, they have optically deep electronic levels associated with them. The optical ionization energies are calculated to be 1.05 eV for GaAs:Si and 0.74 eV for GaAs:S. The optical ionization energies are predicted to increase with pressure or alloying in Al$_x$Ga$_{1-x}$As. In the composition range where the band gap is direct (i.e., x≤0.46) the optical gap is expected to vary as $$\Delta E_{opt} = \Delta E(\Gamma) - \Delta E_{CB} \tag{31}$$

where the second term on the right side represents the shift of the electronic level associated with DX. Substitution of Eqs. (4)-(5) in Eq. (16) gives $\Delta E_{opt}$=0.70x. The optical and thermal ionization energies are seen to have the same dependence on x and to be largest at x≈0.46. The calculated results for GaAs together with Eq. (14) give an $E_{opt}$ of 1.37 eV [1.06 eV] for Si- [S-] induced DX centers at x=0.46. For GaAs, previous results on the pressure dependence of the conduction band states used in conjunction with Eq. (31) predict, for GaAs:Si, a value of $E_{opt}$=1.34 eV for P=33 kbars which is in good agreement with the experimental value of 1.44±0.04 of Li et al., *Physical Review B*, Vol. 36, p. 4531 et seq., 1987. At higher pressures $E_{opt}$ is expected to decrease because the CBM changes from Γ to X and the latter has a negative pressure coefficient. Since DX$^0$ is highly unstable, the absorption of each photon by a DX$^-$ center is predicted to release two electrons into the conduction band.

The results of the pseudopotential calculations provide further insight into how the shallow-deep transition depicted by Eq. (3) takes place. The calculations show that when a neutral Si donor atom is displaced away from its nearest-neighbor along a bond axis, the total-energy increases as expected but the donor level becomes increasingly deeper as the displacement becomes larger. When the level has dropped by more than the on-site Coulomb repulsive term U, which is calculated to be ≈0.20–0.22 eV, the $d^0$ level can capture a free electron without expelling it immediately back into the CBM. At this point the formation of a $d^-$ center leads to a further motion of the Si atom which transforms it into a $DX^-$ center. The energy barrier for electron capture $E_{cap}$ in lightly-doped GaAs is calculated to be $0.55 \pm 0.05$ eV corresponding to the rise in energy for a 0.5 Å displacement of the Si atom. Combining this with the result of the totalenergy calculation which shows that DX is unstable by ≈0.22 eV with respect to shallow donors in GaAs, the emission barrier is estimated to be $0.33 \pm 0.1$ eV.

C. Elimination of DX Centers

1. Substitutional vs. Interstitial Donors

The results of the ab initio pseudopotential calculations discussed in the previous Section B show that the formation of a DX center and the concomitant shallow-deep transition of the donor level in n-type GaAs is accompanied by a bond-breaking distortion at a substitutional donor site. The question naturally arises, therefore, whether the creation of DX centers can be inhibited through the use of donor atoms which give rise to shallow levels but which are not susceptible to the same type of lattice instability. The possibility of replacing substitutional donors with interstitial ones which do not form strong bonds with their surrounding atoms may be considered. This indicates that the conventional doping procedure which relies on the introduction of atoms from column IV or the Periodic Table into the lattice needs to be modified or possibly abandoned. There are many possible choices for interstitial doping of AlGaAs alloys. The simplest choices are probably from group III and V atoms. In the following, the merits of each choice is examined.

2. Interstitial As atoms

Recent calculations of Baraff et al., *Physical Review B*, Vol. 38, p. 6003 et seq., 1988 and *Physical Review B*, Vol. 35, p. 6154 et seq., 1987, suggest that an interstitial As atom has an electronic level which lies above the CBM in GaAs and which, therefore, empties its electron into the conduction band. This electronic level structure provides an explanation for why the isolated As interstitial, if present in GaAs, has not been detected via electron-spin-resonance experiments. Optically detected electron-nuclear double resonance experiments provide, however, strong evidence for the presence of As interstitials in GaAs samples grown in an As rich environment. The presence of As interstitials would provide a simple explanation for the large enhancement in the room temperature free carrier density observed by Basmaji et al., supra, in AlGaAs alloys grown by metalorganic vapor phase epitaxy under a very high As/(Ga+Al) ratio of 95. The samples in this experiment were doped with Sn which, according to theory, will actually tend to reduce the free electron concentration arising from the As interstitial atoms because of its tendency to form DX centers in high Al content alloys. As indicated in connection with the three samples in Part I, the experimental results indicate that donors not susceptible to DX-like instabilities, which arise from As interstitials, can be introduced into AlGaAs alloys with a high Al content with densities of about $2-3 \times 10^{17}$ cm$^{-3}$. In these samples the free carrier density is observed to decrease with increasing Si impurity content in AlGaAs alloys with high Al densities and to increase with it when the Al content is low.

The use of a high As flux during growth can lead to the formation of As antisites in addition to As interstitials. The As antisite defect is known to be a (deep) donor so it should not interfere with the n-type doping resulting from interstitial arsenic atoms.

3. Interstitial Al, Ga, and B

Interstitial group III dopants have three valence electrons two of which are in low energy s-states and would lie below the VBM in AlGaAs alloys and the other is a p-electron with an energy that, in the limit of weak interactions with neighboring atoms, should fall several eV above the CBM, for Ga and Al and near the CBM of GaAs for B. An interstitial atom is, in general, strongly interacting with its neighbors. The ab initio self-consistent calculations of Baraff et al., *Physical Review Letters*, Vol. 55, p. 1327 et seq., 1985, demonstrate, however, that interstitial Ga does, in fact, behave as a donor and not an acceptor in GaAs. These group III atoms, particularly Ga and Al, would be, therefore, ideally suited for n-type doping if they can be in some manner introduced into interstitial sites. A potential problem with trying to incorporate these atoms into the lattice via ion implantation is the possibility of forming substitutional cation antisites which will behave as double acceptors in n-type materials thereby compensating the donor electrons arising from the interstitial atoms. However, Ga antisites should be statistically balanced by other donor type defects. For example, the creation of an As-interstitial, As-vacancy pair will lead to n-type behavior since the As interstitial and As vacancy defects are individually donor type defects. A Ga vacancy defect would be an acceptor and it would have a high probability of annealing out as a result of recombination with either Ga or As interstitial atoms. The formation of energies for these defects is very sensitive to $E_F$ with acceptor-like defects becoming energetically more favorable in n-type samples and vice versa. Despite the potential complications of introducing interstitial donors, and the question of the stability of these donors, the possibilities for this type of doping procedure are very important and deserve more critical experimental investigations.

The only group III atom which has been examined so far for its effect on DX centers is boron. The experiments of Li et al., supra, show that incorporation of B in Si-doped GaAs leads to two new donor levels with reduced emission and capture activation energies (compared to DX centers). The experiments were carried out at pressures of 20–30 kbars where DX is ordinarily more stable than shallow donors. A similar effect has not yet been found in an AlGaAs alloy. The fact that the DX centers are observed to go away with the introduction of B could be indicative of B-Si complex formation which prevents the Si atom from going into the threefold coordinated interstitial position necessary for DX formation. Since the concentration of the B impurities in the samples studied was at least twice that of Si, the possibility of interstitial B atoms which are not interacting with any Si atoms cannot be discounted. A different possible explanation is discussed below.

I have done self-consistent pseudo-potential calculations on interstitial B in pure GaAs and have tested two different interstitial positions for which the nearest neighbors of B are either all Ga ($T_{d1}$) or all As atoms ($T_{d2}$). I find that for the relaxed structures, the most stable site for B, in either neutral or negative charge states, is at the $T_{d2}$ site whereas for a positive charge state it is at the $T_{d1}$ site. The energy differences between the two sites are nearly 0.22 eV for $B^0$, 0.4 eV for $B^-$, and 0.2 eV for $B^+$. Combining the results of our calculations for B with those for Si we find that the reaction $$DX^- + B^0 \rightarrow d^0 + B^-, \qquad (32)$$

in which a Si induced $DX^-$ center is transformed into a neutral substitutional dopant $d^0$ altering the charge state of an interstitial B atom at $T_{d2}$ which is not necessarily close to the Si atom, does not cost any energy to within $0.01 \pm 0.1$ eV. A direct interaction between a DX center and B may not be needed therefore for DX to become unstable in the presence of boron. Since $DX^-$ centers are more stable than $d^0$ ones at the high pressures where the experiments are done, the combination of Eqs. (3) and (32) suggests that the overall reaction:

$$DX^- + 2B^0 \rightarrow d^+ + 2B^- \qquad (33)$$

may be exothermic under pressure. This would lead to a complete disappearance of DX centers when the B interstitial concentration is at least equal to the Si concentration. It should be emphasized again that this reaction does not depend on having the B and Si atoms in close proximity of each other. A boron concentration in excess of that of Si (or other donors) would lead to the presence of $B^0$ in addition to $B^-$ interstitials in GaAs, unless B is a negative U center. The experiments of Li et al., supra, showing the presence of two different boron induced donor levels in Si doped GaAs could be associated with the two charge states of boron interstitials.

D. Summary

In conclusion, experimental data on the composition, pressure, and dopant concentration dependence of the DX binding energy in $Al_xGa_{1-x}As$ alloys were analyzed using a simple theoretical model. The results of ab initio pseudopotential calculations indicate that DX is a negatively charged and highly localized defect center resulting from a large lattice distortion leading to bond rupture at the donor site. The analysis and discussion concludes that DX centers are associated with substitutional donors only and that it is possible to reduce their concentration by introducing interstitial dopants which do not undergo the same type of large lattice relaxations responsible for deep electron trap formation. The possibilities of using group III or V elements for this purpose are examined and confirmed by experiment.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of avoiding or suppressing the DX center formation in a Group III-V semiconductor comprising the step of doping said Group III-V semiconductor with a Group III or Group V dopant, said doping characterized by the atoms of said dopant substantially forming at interstitial sites of the lattice structure of said Group III-V semiconductor rather than forming substitutional sites of the lattice structure of said Group III-V semiconductor.

2. A method of avoiding or suppressing the DX center formation in a Group III-V semiconductor comprising the step of introducing doping atoms at interstitial sites in the crystal lattice of said Group III-V semiconductor providing shallow donor levels with sufficient structural stability to not form deep levels in said crystal lattice.

3. The method of claim 2 wherein said step of introducing comprises the introducing said interstitial doping atoms under the influence of a high overpressure during chemical vapor deposition of said Group III-V semiconductor.

4. The method of claim 3 wherein said Group III-V semiconductor comprises GaAs or $Al_xGa_{1-x}As$ wherein X is equal to or greater than 22% and said interstitial doping atoms comprise As, Sb, Ga, Al or B.

5. The method of claim 2 wherein said step of introducing comprises the implanting of said interstitial doping atoms after the growth of said Group III-V semiconductor.

6. The method of claim 5 wherein said Group III-V semiconductor comprises GaAs or $Al_xGa_{1-x}As$ wherein X is equal to or greater than 22% and said interstitial doping atoms comprise As, Sb, Ga, Al or B.

* * * * *

UNITED STATES PATENT AND TRADEMARK OFFICE
CERTIFICATE OF CORRECTION

PATENT NO. : 5,139,960

DATED : 18 August 1992

INVENTOR(S) : James D. Chadi

It is certified that error appears in the above--identified patent and that said Letters Patent is hereby corrected as shown below:

On the title page of the patent, in the title, Field 54, change "INTERSTITITAL" to --INTERSTITIAL--, so that the title now reads: INTERSTITIAL DOPING IN III-V SEMICONDUCTORS TO AVOID OR SUPPRESS DX CENTER FORMATION.

Column 1, line 1, change "INTERSTITITAL" to --INTERSTITIAL--.

Signed and Sealed this

Twenty-eighth Day of September, 1993

Attest:

BRUCE LEHMAN

*Attesting Officer*     *Commissioner of Patents and Trademarks*